(12) United States Patent
Fukui

(10) Patent No.: US 6,292,392 B1
(45) Date of Patent: *Sep. 18, 2001

(54) NON-VOLATILE SEMICONDUCTOR DEVICE

(75) Inventor: Haruyasu Fukui, Nara-ken (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,714

(22) Filed: Sep. 30, 1998

(30) Foreign Application Priority Data

Sep. 30, 1997 (JP) ................................... 9-266116
Sep. 11, 1998 (JP) .................................. 10-259014

(51) Int. Cl.$^7$ ................................................... G11C 16/04
(52) U.S. Cl. .............................. 365/185.11; 365/185.21; 365/230.03
(58) Field of Search ........................ 365/185.21, 185.11, 365/230.03

(56) References Cited

U.S. PATENT DOCUMENTS

| | | | | |
|---|---|---|---|---|
| 5,615,166 | * | 3/1997 | Machida | 365/230.08 |
| 5,708,603 | * | 1/1998 | Tanaka | 365/185.21 |
| 5,732,018 | * | 3/1998 | Choi et al. | 365/185.21 |
| 5,748,528 | * | 5/1998 | Campardo et al. | 365/185.11 |
| 5,867,430 | * | 2/1999 | Chen et al. | 365/185.11 |

\* cited by examiner

*Primary Examiner*—Richard Elms
*Assistant Examiner*—Van Thu Nguyen
(74) *Attorney, Agent, or Firm*—Morrison & Foerster LLP

(57) ABSTRACT

A non-volatile memory device includes: a plurality of memory cell arrays including a plurality of blocks, each block including a matrix of memory cells coupled to one another via word lines and bit lines such that corresponding ones of the word line in the plurality of blocks of each memory cell array are coupled to a common, the word lines being commonly driven by decoders respectively provided for the memory cell arrays, where all data stored in each block is subject to erasure in one erase operation, the non-volatile memory device further including: a plurality of sense amplifiers for reading data from the memory cells; and a control circuit for simultaneously performing a plurality of operations by using the plurality of sense amplifiers.

11 Claims, 9 Drawing Sheets

171,172 ••• Y decoder
181,182 ••• Bit line selection circuit
19 ••• Sense amplifier switching circuit 171,172 ··· Y decoder
181,182 ··· Bit line selection circuit
19 ··· Sense amplifier switching circuit 171A, 172A · · · Y decoder
181A, 182A · · · Bit line selection circuit
19 · · · Sense amplifier switching circuit
200, 201 · · · Block selection control circuit
210, 211 · · · Block selection circuit 171,172 ··· Y decoder
181,182 ··· Bit line selection circuit
19 ··· Sense amplifier switching circuit 171A, 172A ··· Y decoder
181A, 182A ··· Bit line selection circuit
19 ··· Sense amplifier switching circuit
200, 201 ··· Block selection control circuit
210, 211 ··· Block selection circuit

*PRIOR ART*

PRIOR ART

NON-VOLATILE SEMICONDUCTOR DEVICE

BACKGROUND OF THE INVENTION

1. Field of the Invention

The present invention relates to a rewritable non-volatile memory device such as an EEPROM (electrically erasable and programmable read only memory) or a flash memory.

2. Description of the Related Art

First, the general structure of a non-volatile memory device will be described.

FIG. 7 illustrates the structure of a memory cell in a non-volatile memory device. The memory cell MC includes a control gate CG, a floating gate FG, a source S, and a drain D. The memory cell MC stores data in accordance with electrons injected to the floating gate FG.

FIG. 8 illustrates the block structure of a NOR type flash memory, and particularly shows the relationship between an X-decoder XD and word lines WL1, WL2, . . . , WLm.

Flash memories define one class of non-volatile memory devices. A typical connection method for memory cells of a flash memory is referred to as a NOR type. In a NOR type flash memory FM shown in FIG. 8, mxn memory cells MC are coupled in a matrix, designated block BLK1 or BLK2.

The structure of each of the blocks BLK1 and BLK2 will now be described. To each of m word lines WL1, . . . , WLm, n control gates CG are coupled. To each of n bit lines BL1, . . . , BLn, m drains D are coupled. Sources S of all memory cells MC are coupled to a common. Hereinafter, being coupled to a common shall meant that each device is coupled together via one or more lines. The details of an erase operation of such a NOR type flash memory will be described in detail later. Since the sources S are coupled to a common within each block BLK1 or BLK2, erasing any data stored in a given memory cell MC results in erasing all the data stored in the entire block. In other words, it is impossible to selectively erase the data in any single memory cell in a bit-by-bit manner. The word lines in one block are coupled to the corresponding word lines in the other block, so that they are commonly driven in accordance with an output signal from the X-decoder XD.

Referring to FIGS. 7 and 8, a read operation, a write operation, and an erase operation of the abovedescribed flash memory FM will be described.

The read operation for the flash memory FM occurs as follows. When a read signal (including a control signal, an address signal, etc.) is supplied from outside of the flash memory FM, a high voltage (e.g., 5 V) is applied to the control gate CG; a low voltage (e.g., 1 V) is applied to the drain D; and a low voltage (e.g., 0 V) is applied to the source S. By detecting the level of the current flowing in the path between the source S and the drain D, the sequence of "1"s and "0"s of the data stored in the memory cell MC is determined. Then, the data read from the memory cell MC is sent to elements outside of the flash memory FM, thereby completing the read operation.

The write operation for the flash memory FM occurs as follows. When a control signal, data, and an address signal are supplied from outside of the flash memory FM, a high voltage (e.g., 12 V) is applied to the control gate CG; a high voltage (e.g., 7 V) is applied to the drain D; and a low voltage (e.g., 0 V) is applied to the source S. The hot electrons which are generated in the vicinity of the drain junction are injected to the floating gate FG due to the high voltage applied to the control gate CG. Thereafter, the writing is inactivated and a verify operation takes place. The write operation is complete when the memory cell to which data has been written successfully passes verification. If verification fails, the data is rewritten, followed by another verification. If verification fails after this cycle has been performed a predetermined number of times, a status signal indicating "write error" is returned to elements outside of the flash memory FM.

The erase operation for the flash memory FM occurs as follows. It should be noted that, as mentioned earlier, the erase operation occurs for the entire block, rather than each memory cell therein. When an erase signal (including a control signal and an address signal) are supplied from outside of the flash memory FM, a low voltage (e.g., 0 V) is applied to the control gate CG; a low voltage (e.g., 0 V) is applied to the drain D; and a high voltage (e.g., 12 V) is applied to the source S. With the application of such voltages, a strong electric field is generated between the floating gate FG and the source S, so that the electrons in the floating gate FG can be discharged to the source S due to a tunnel effect. Thereafter, the erasing is inactivated and a verify operation takes place, as in the case of writing. The erase operation is complete when all of the memory cells within the block to be erased successfully pass verification. If verification fails, an erase operation is performed again, followed by another verification. If verification fails after this cycle has been performed a predetermined number of times, a status signal indicating "erase error" is returned to elements outside of the flash memory FM.

In general, the speeds of the read operation, write (including verification) operation, and erase (including verification) operation are of the relationship: "reading speed">"writing (including verification) speed">"erasing (including verification) speed". For example, the read operation may take about 100 ns; the write (including verification) operation may take about 60 $\mu$s; and the erase (including verification) operation may take about 300 ms. Thus, the write and erase operations are several orders of magnitude slower than the read operation. Therefore, it would be very useful in a flash memory to perform a read operation during a write (including verification) operation and an erase (including verification) operation.

FIG. 9 illustrates the block structure of a conventional non-volatile memory device. The conventional non-volatile memory device includes a memory cell array 101 (including blocks 111, 112, 113, and 114) and a memory cell array 102 (including blocks 115, 116, 117, and 118). In each of the memory cell arrays 101 and 102, the corresponding word lines of each block are coupled to a common. The word lines of the memory cell arrays 101 and 102 are commonly driven by X-decoders 131 and 132, respectively. Source line voltage switching elements 121, . . . , 128 selectively apply predetermined voltages to the source lines of the corresponding blocks 111, . . . , and 118.

A common sense amplifier 64 is provided for the blocks 111, 112, 113, and 114 and the blocks 115, 116, 117, and 118. A control circuit 15 includes a read control circuit 151, a write control circuit 152, an erase control circuit 153, a source switch control circuit 154, a sense amplifier control circuit 155, and a verify control circuit 156. The non-volatile memory device further includes an input/output interface circuit 16 for managing the exchange of signals between the control circuit 15 and elements outside of the memory, Y-decoders 171 and 172, and bit line selection circuits 181 and 182.

FIG. 10 is a structural diagram illustrating the relationship between the memory cell array 101 (the blocks 111, 112, 113, and 114) the X-decoder 131, the Y-decoder 171, the bit line selection circuit 181, and the sense amplifier 64 in the conventional non-volatile memory device.

Referring to FIG. 9, the operations of the conventional non-volatile memory device will be described.

An erase operation for the block 111 occurs as follows. First, the control circuit 15 switches the source line voltage switching element 121 which is coupled to the block 111, thereby setting the source voltage in the block 111 at a high voltage (e.g., 12 V). Furthermore, the control circuit 15 applies a low voltage (e.g., 0 V) to the word lines during the application of an erase pulse, and a high voltage (e.g., 5 V) during an erase verify operation, via the X-decoder 131.

The X-decoder 132 is available during the erase operation. However, since the sense amplifier 64 is used for the erase verify operation, it is impossible to perform a read operation for the blocks coupled to the X-decoder 132, (i.e., the blocks 115, 116, 117, and 118 in the memory cell array 102). In other words, it is impossible to perform a read operation for the blocks 115 to 118 without quitting the erase operation for the block 111. This may present a major disadvantage in the case where the erase operation requires a long time.

According to another conventional method, a plurality of conventional non-volatile memory devices are employed in order to perform two or more operations of the erase, write, and/or read operations. As a result, a plurality of functions are provided by the entire system while non-volatile memory device is performing only one function. While this conventional method of employing a plurality of non-volatile memory devices may be useful in the case where the erase or write operation requires a much longer time than the read operation, mounting a number of non-volatile memory devices will result in a larger area being occupied on the chip, and is inevitably subject to practical constraints, which are undesirable for the minimization of size and mass.

A non-volatile memory device capable of simultaneously performing an erase or write (including verification) operation and a read operation is disclosed in Japanese Laid-open Publication No. 7-281952. However, this non-volatile memory device has a problem in that it occupies a large area on the chip because control circuitry including a sense amplifier, an X-decoder, and the like is provided for each block.

As discussed above, any single conventional non-volatile memory device can only perform one function of a read, write, or erase operation. Therefore, during an erase operation, for example, the erase operation must be cancelled before a read operation can be performed. Any conventional attempt to solve this problem by incorporating a plurality of non-volatile memory devices results in a large area being occupied on the chip, inevitably calling for some constraints. The non-volatile memory device disclosed in Japanese Laid-open Publication No. 7-281952 has a problem of occupying a very large area on the chip because a sense amplifier, an X-decoder, and the like is provided for each block.

SUMMARY OF THE INVENTION

A non-volatile memory device according to the present invention includes: a plurality of memory cell arrays including a plurality of blocks, each block including a matrix of memory cells coupled to one another via word lines and bit lines such that corresponding ones of the word lines in the plurality of blocks of each memory cell array are coupled to a common, the word lines being commonly driven by decoders respectively provided for the memory cell arrays, where all data stored in each block is subject to erasure in one erase operation, the non-volatile memory device further including: a plurality of sense amplifiers for reading data from the memory cells; and a control circuit for simultaneously performing a plurality of operations by using the plurality of sense amplifiers.

In one embodiment of the invention, the number of memory cells is equal to the number of sense amplifiers.

In another embodiment of the invention, the plurality of sense amplifiers includes a sense amplifier dedicated to a read operation and a sense amplifier dedicated to verification.

In still another embodiment of the invention, the non-volatile memory device further includes a sense amplifier switching circuit for switching one of the plurality of sense amplifiers coupled to a selected one of the plurality of memory cell arrays.

In still another embodiment of the invention, the control circuit includes a sense amplifier switching control circuit for outputting a control signal, and the sense amplifier switching circuit switches one of the plurality of sense amplifiers coupled to the selected one of the plurality of memory cell arrays in accordance with the control signal.

In still another embodiment of the invention, the non-volatile memory device further includes a bit line selection circuit provided between the sense amplifier switching circuit and each of the plurality of memory cell arrays, the bit line selection circuit selecting a first bit line for each memory cell array from among the bit lines, and the sense amplifier switching circuit selectively couples one of the plurality of sense amplifiers to the first bit line.

In still another embodiment of the invention, the non-volatile memory device further includes a Y-decoder provided for each of the plurality of memory cell arrays, and the bit line selection circuit selects the first bit line in accordance with a signal from the Y-decoder.

In still another embodiment of the invention, the non-volatile memory device further includes: a bit line selection circuit provided between the sense amplifier switching circuit and each of the plurality of memory cell arrays, the bit line selection circuit selecting a first bit line for each block from among the bit lines, and a block selection circuit for selecting a second bit line for each memory cell array from among the first bit lines selected for the respective blocks, the sense amplifier switching circuit selectively coupling one of the plurality of sense amplifiers to the second bit line.

In still another embodiment of the invention, the non-volatile memory device further includes a Y-decoder provided for each of the plurality of memory cell arrays, and a block selection control circuit provided for each of the plurality of memory cell arrays, and wherein the bit line selection circuit selects the first bit line in accordance with a signal from the Y-decoder, and the block selection circuit selects the second bit line in accordance with a signal from the block selection control circuit.

In still another embodiment of the invention, the plurality of operations include a read operation, an erase operation including verification, and a write operation including verification.

For example, in an embodiment incorporating two memory cell arrays and two sense amplifiers, an erase verify operation for one of the two memory cell arrays can be performed by using one of the two sense amplifiers, while the other sense amplifier can be used to perform a read operation for the other memory cell array.

The advantage of simultaneously performing an erase verify operation and a read operation is as follows:

An erase operation is always followed by a verify operation. If the result of verification does not satisfy predetermined conditions, then erase pulses are repeatedly- applied to reiterate the erase operation (i.e., the erase operation continues) until the verification conditions are satisfied. If there is only one sense amplifier available, it is impossible to perform a read operation before an ongoing erase operation is finished. However, by incorporating two sense amplifiers, for example, the remaining sense amplifier can be used for performing a read operation, substantially independent of how long the ongoing erase operation may take.

Thus, the invention described herein makes possible the advantage of providing a non-volatile memory device which is capable of simultaneously performing an erase operation or write (including verification) operation and a read operation without the need of incorporating a plurality of such non-volatile memory devices, thereby minimizing the area occupied on the chip.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

EXAMPLE 1

Figure 1:
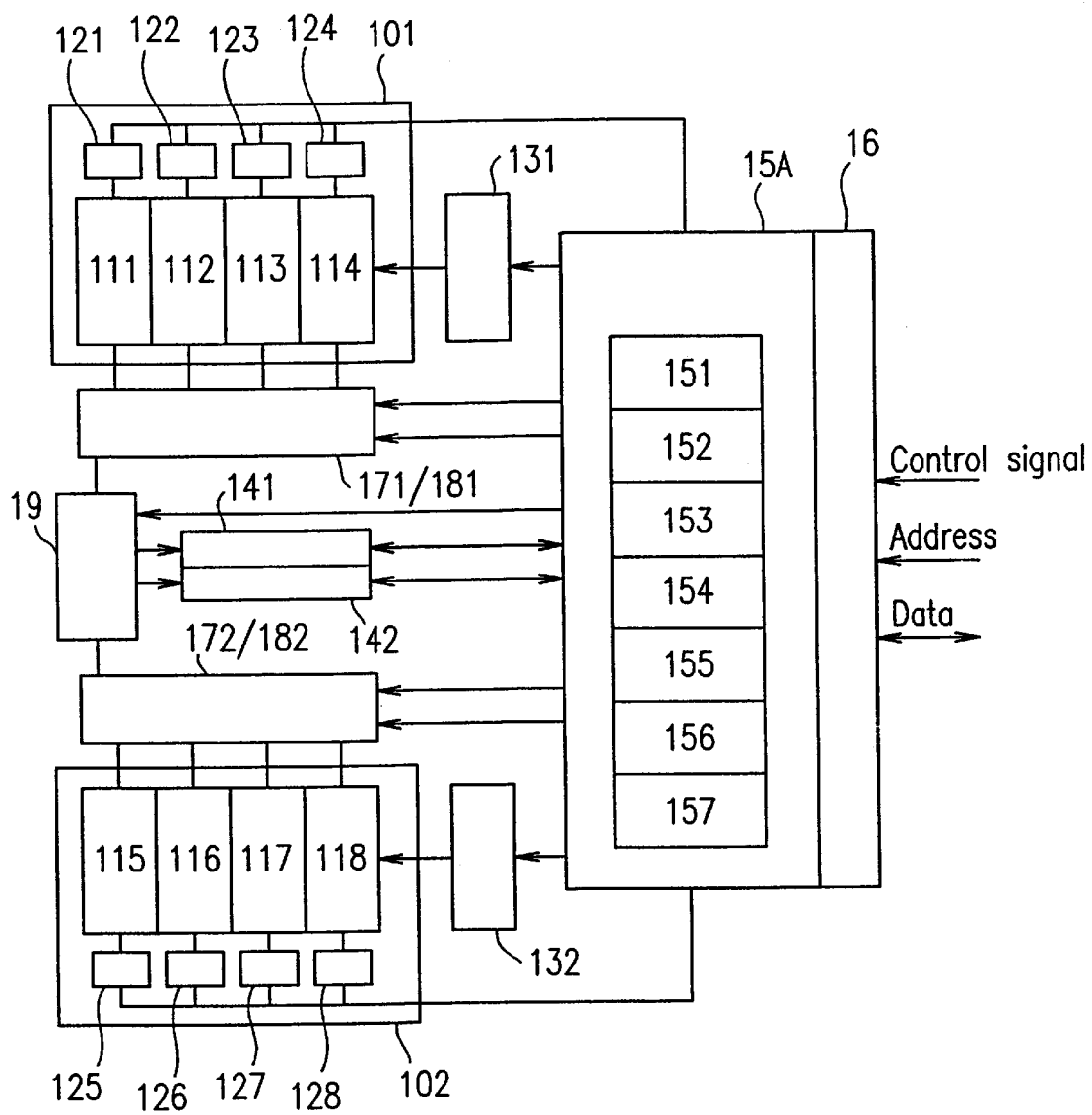
FIG. 1 is a block diagram illustrating the structure of a flash memory according to Example 1 of the present invention.
Figure 9:
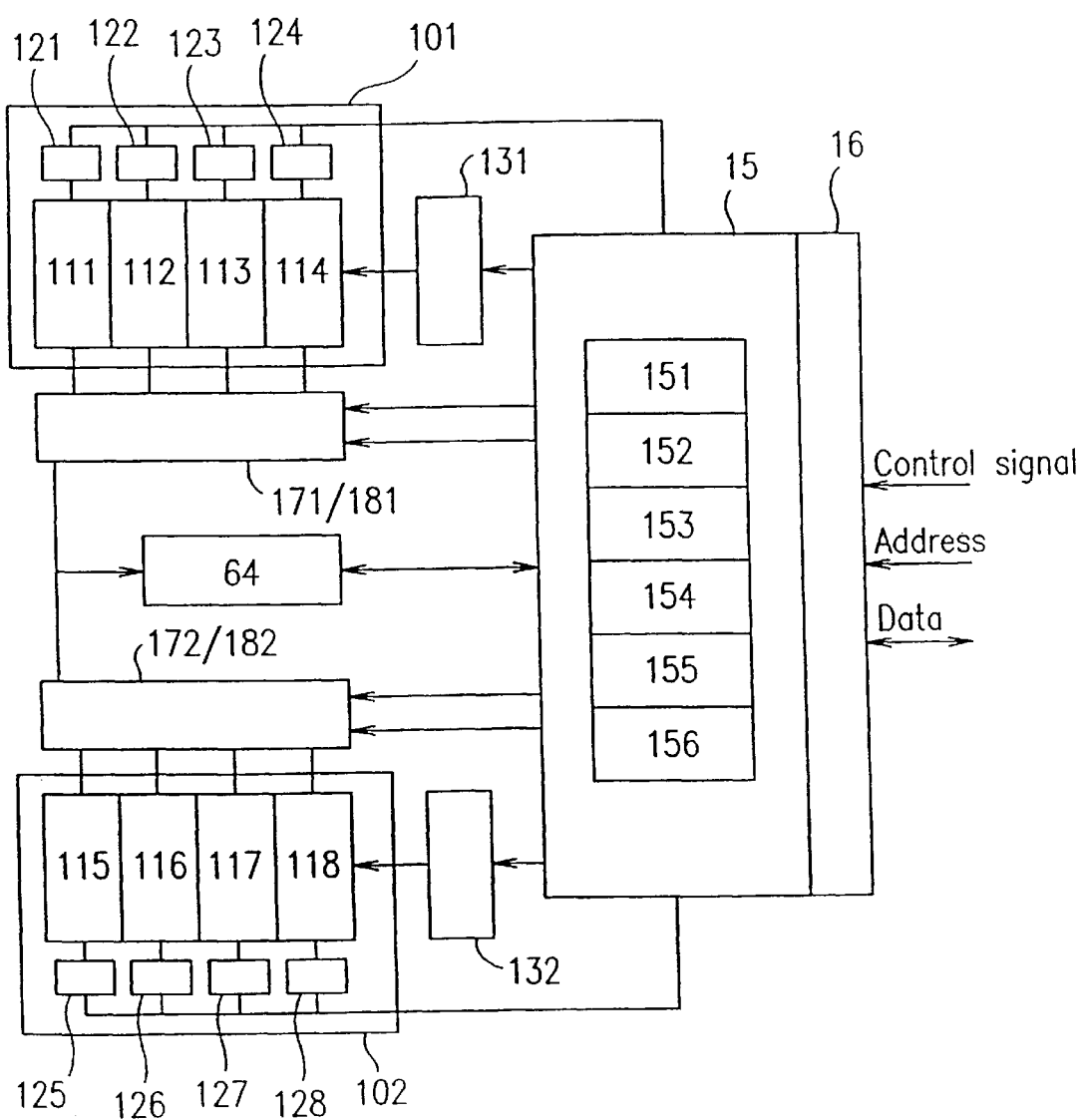
FIG. 9 is a block diagram illustrating a conventional non-volatile memory device.
Figure 10:
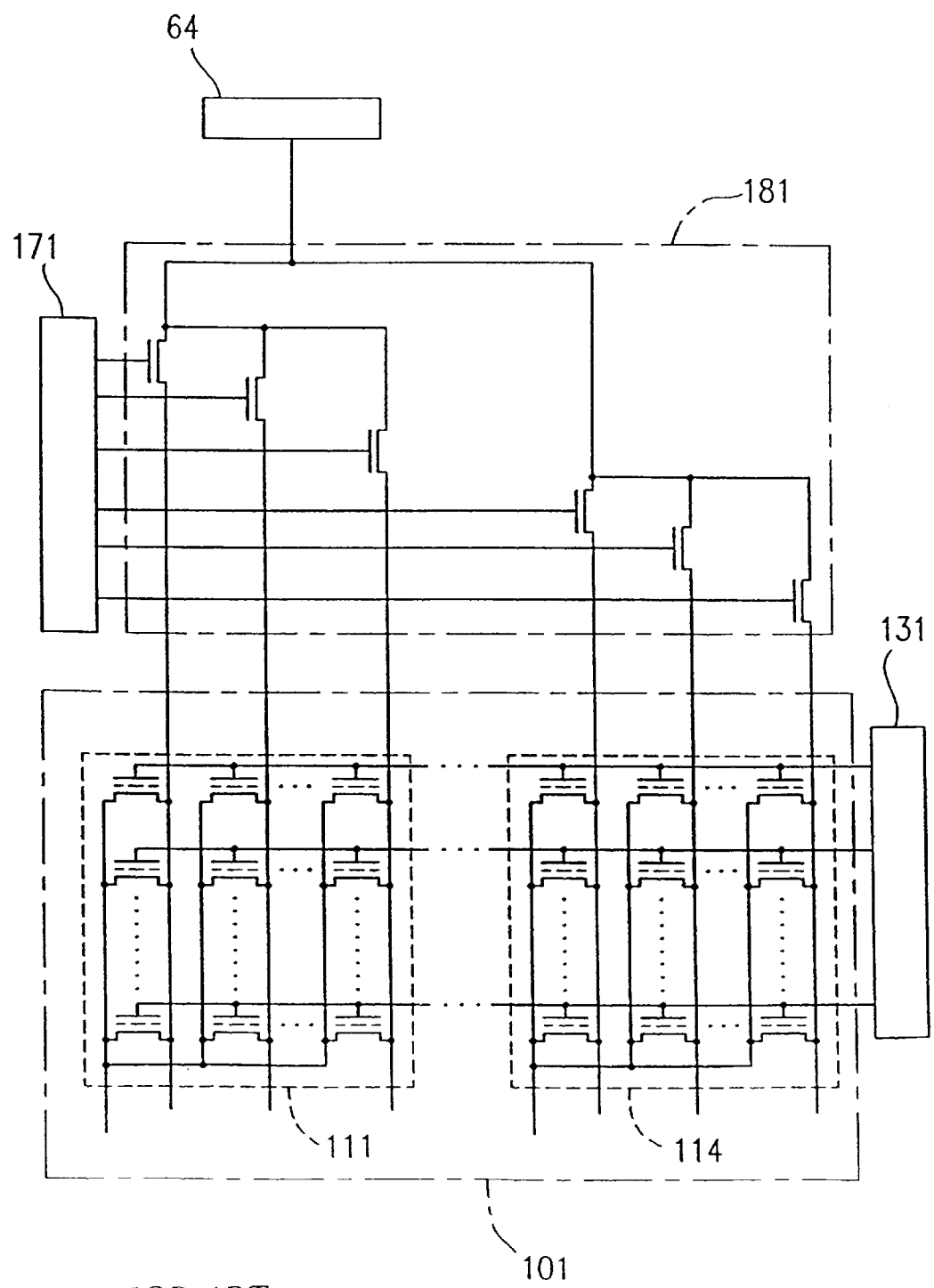
FIG. 10 is a block diagram illustrating a Y-decoder and a sense amplifier in a conventional non-volatile memory device.

FIG. 1 is a block diagram illustrating the structure of a flash memory according to Example 1 of the present invention. One difference from the conventional non-volatile memory device shown in FIG. 9 is that there are provided as many (i.e., two) sense amplifiers as there are memory cell arrays. Those elements in FIG. 1 which correspond to the above-described elements in FIG. 9 are denoted by the same reference numerals as used therein, and the description thereof is omitted.

Figure 8:
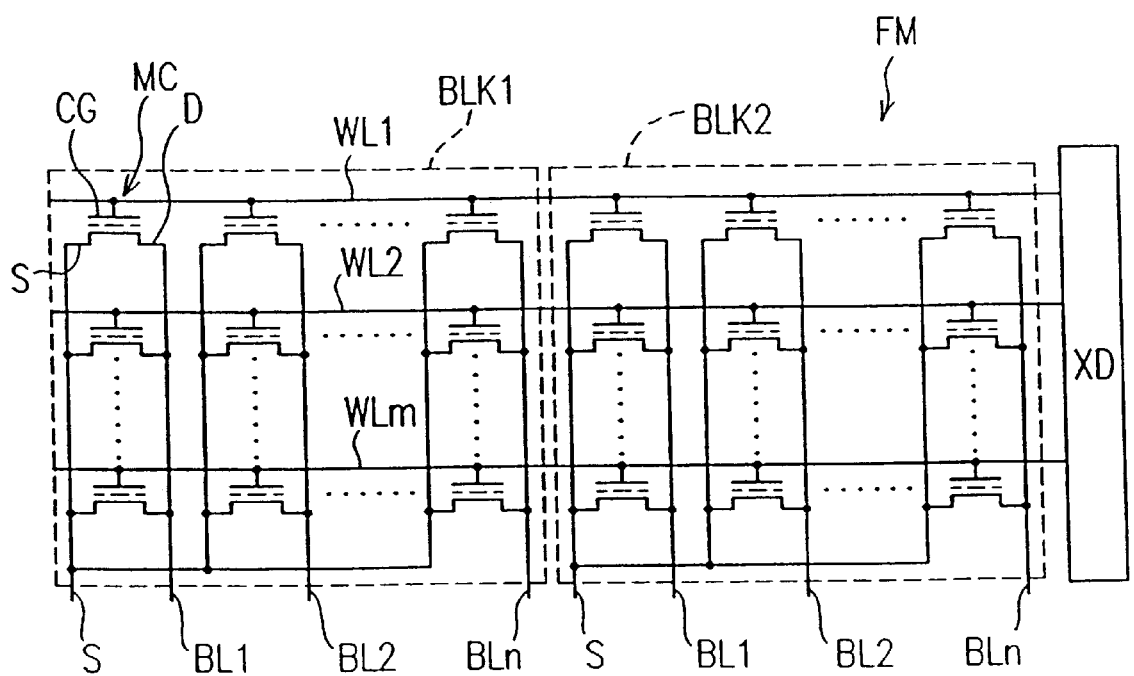
FIG. 8 is a circuit diagram illustrating the block structure of a NOR type flash memory and particularly showing the relationship between an X-decoder and word lines.

As shown in FIG. 1, all the memory cells are grouped into two memory cell arrays 101 and 102. The memory cell array 101 includes blocks 111, 112, 113, and 114; and the memory cell array 102 includes blocks 115, 116, 117, and 118. Herein, all data stored in each entire block will be-erased in a single erase operation, as in the conventional non-volatile memory device structure. Source line voltage switching elements 121, 122, 123, 124, 125, 126, 127, and 128 are respectively provided for the blocks 111, 112, 113, 114, 115, 116, 117, and 118. X-decoders 131 and 132 are respectively provided for the memory cell arrays 101 and 102. The word lines of the four blocks 111 to 114 of the memory cell array 101 and the word lines of the four blocks 115 to 118 of the memory cell array 102 are commonly driven by the X-decoders 131 and 132, respectively. The word lines are coupled to their respective x-decoders 131 and 132 in a manner similar to the configuration of the word lines WL1, WL2, . . . , WLm shown in FIG. 8 and are not, therefore, again shown for sake of brevity.

Furthermore, sense amplifiers 141 and 142, Y-decoders 171 and 172, bit line selection circuits 181 and 182, and a sense amplifier switching circuit 19 are provided as illustrated in FIG. 1. The memory cell array 101 can be selectively coupled to either the sense amplifier 141 or 142, while the memory cell array 102 can be selectively coupled to the other of the sense amplifier 142 or 141. Of course, the memory cell arrays 101 and 102 cannot be coupled to the same sense amplifier 141, 142 at the same time.

The non-volatile memory device further includes a control circuit 15A for controlling the memory cell arrays 101 and 102, the X-decoders 131 and 132, the sense amplifiers 141 and 142 and other elements, and an input/output interface circuit 16 for managing the exchange of signals between the control circuit 15A and elements outside of the flash memory. In addition to those elements which are generally employed in a conventional non-volatile memory device, i.e., a read control circuit 151, a write control circuit 152, an erase control circuit 153, a source switch control circuit 154, a sense amplifier control circuit 155, and a verify control circuit 156, the control circuit 15A also includes a sense amplifier switching control circuit 157.

An erase operation for the block 111 in the memory cell array 101 occurs as follows. When the control circuit 15A receives an erase command, the erase control circuit 153 in the control circuit 15A switches the source line voltage switching element 121 which is coupled to the block 111, thereby setting the source voltage in the block 111 at a high voltage (e.g., 12 V). Furthermore, the control circuit 15A applies a low voltage (e.g., 0 V) to all of the word lines (not shown) in the memory cell array 101 (to which the block, 111 belongs) via the X-decoder 131. Next, the control circuit 15A applies to the word lines a voltage necessary for the read operation (high voltage, e.g., 5 V) in order to perform an erase verify operation. In this state, the verify control circuit 156 in the control circuit 15A performs an erase verify operation by using the sense amplifier 141.

The present invention makes it possible to perform a read operation for a memory cell in the block 115 of the memory cell array 102 at the same time the above-described erase operation is taking place. When a read command is input to the control circuit 15A, the read control circuit 151 and the sense amplifier switching control circuit 157 check if the memory cell desired to be read is in a block within the same memory cell array 101 that the currently-erased block 111 belongs to.

If the memory cell to be read is determined to be within the same memory cell array 101 that the currently-erased block 111 belongs to, the control circuit 15A returns an error message to elements outside the non-volatile memory device. If the memory cell to be read is determined to be in the other memory cell array 102, the control circuit 15A now knows that it is possible to read that memory cell, and hence applies a voltage necessary for the read operation (high voltage, e.g., 5 V) to the word lines. Moreover, upon detecting that the sense amplifier 141 is being used for erasing the data stored in the block 111, the control circuit 15A causes the sense amplifier switching control circuit 157 to switch the sense amplifier switching circuit 19 so as to make the sense amplifier 142 available for the reading operation for the block 115.

A general principle of the present invention is as follows. When the control circuit 15A receives an input command (e.g., a read command, a write command, or an erase command), it is first determined whether or not the block which is subject to such an input command is in the same memory array that includes a block for which a certain operation is currently ongoing. If the block subject to an input command is determined to be in the same memory cell array which includes the block currently undergoing an operation, the control circuit 15A outputs an error message to elements outside the non-volatile memory device indicating that the input command cannot be executed. On the other hand, if the block subject to an input command is determined to be in the other memory cell array, the input command can be advantageously executed by utilizing one of the sense amplifiers which is not being used.

Even if both blocks are determined to be in respectively different memory cell arrays, an input command cannot be executed while both sense amplifiers are being used, so that an error message is output to elements outside the non-volatile memory device. The determination as to whether a sense amplifier is being used or not can be achieved by providing in the control circuit 15A a flag or the like indicating the use/non-use state of each sense amplifier and checking the flag at the time of receiving an input command.

Figure 2:
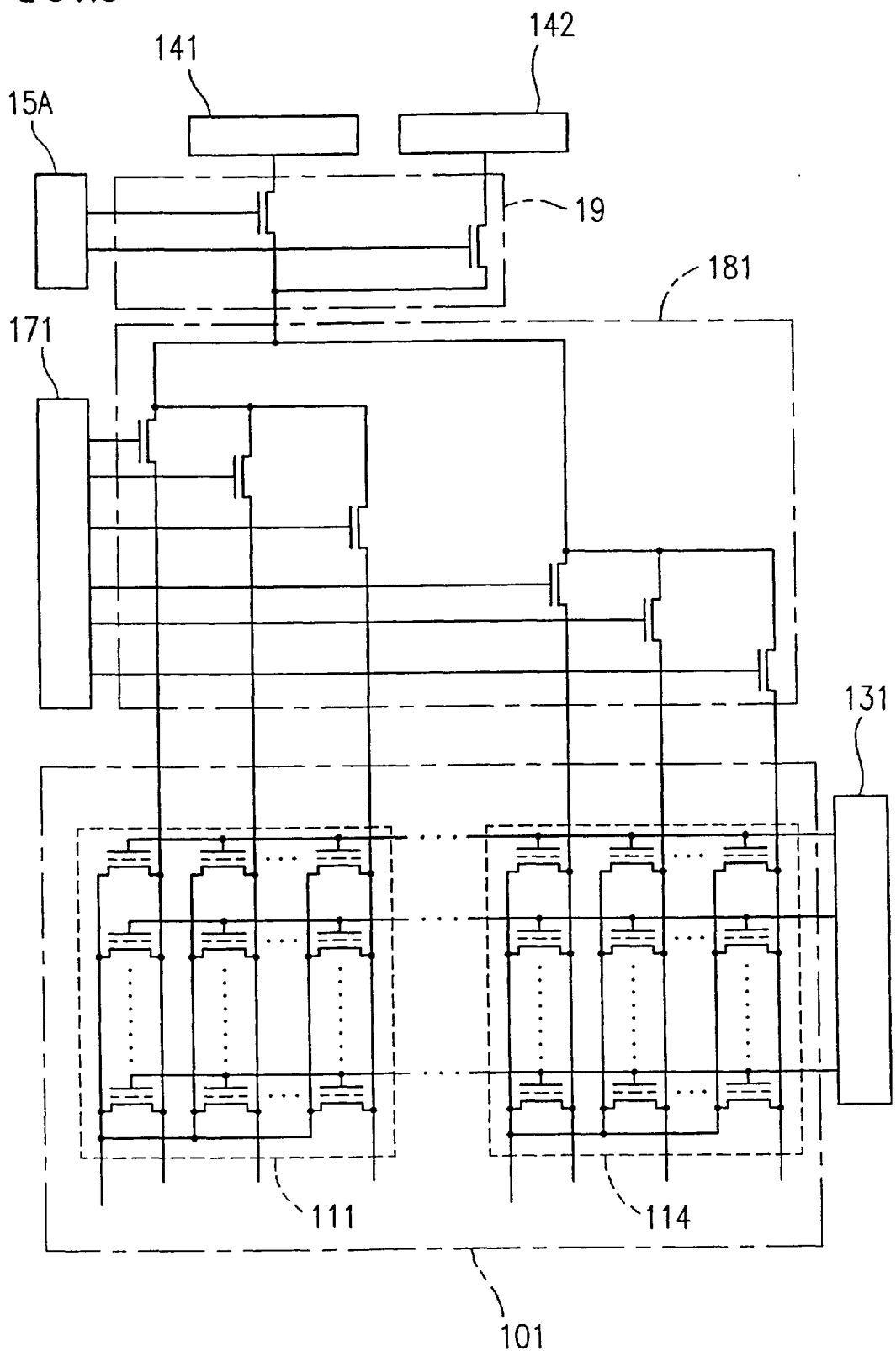
FIG. 2 is a diagram illustrating a sense amplifier switching circuit 19 and a bit line selection circuit 181 according to Example 1 of the present invention.

Next, with reference to FIG. 2, there is shown an exemplary internal structure of the sense amplifier switching circuit 19, the bit line selection circuit 181, and the memory cell array 101. It should be noted that FIG. 2 only shows the memory cell array 101, the blocks 111 and 114, the X-decoder 131, the Y-decoder 171, and the bit line selection circuit,181, while the blocks 112 and 113 are omitted from the figure. The sense amplifier switching circuit 19 selectively outputs an output signal from the bit line selection circuit 181 to either the sense amplifier 141 or 142 based on a control signal from the sense amplifier switching control circuit 157 in the control circuit 15A. Although only the memory cell array 101 and its associated elements are shown in FIG. 2, it will be appreciated that the same is also true of the memory cell array 102 and its associated elements.

The principle of the present invention is not limited to simultaneously performing an erase operation and a read operation as described above. Taking advantage of the incorporation of two sense amplifiers, it is possible to simultaneously perform any combination of two of the following: a read operation, a write (including verification) operation, and an erase (including verification) operation.

According to the present invention, in general, a non-volatile memory device incorporating N (N≧2) memory cell arrays each including a plurality of blocks controlled by a common X-decoder and incorporating M sense amplifiers (2≦M≦N) can simultaneously perform M or less functions, i.e., a read operation, a write (including verification) operation, and an erase (including verification) operation.

Figure 3:
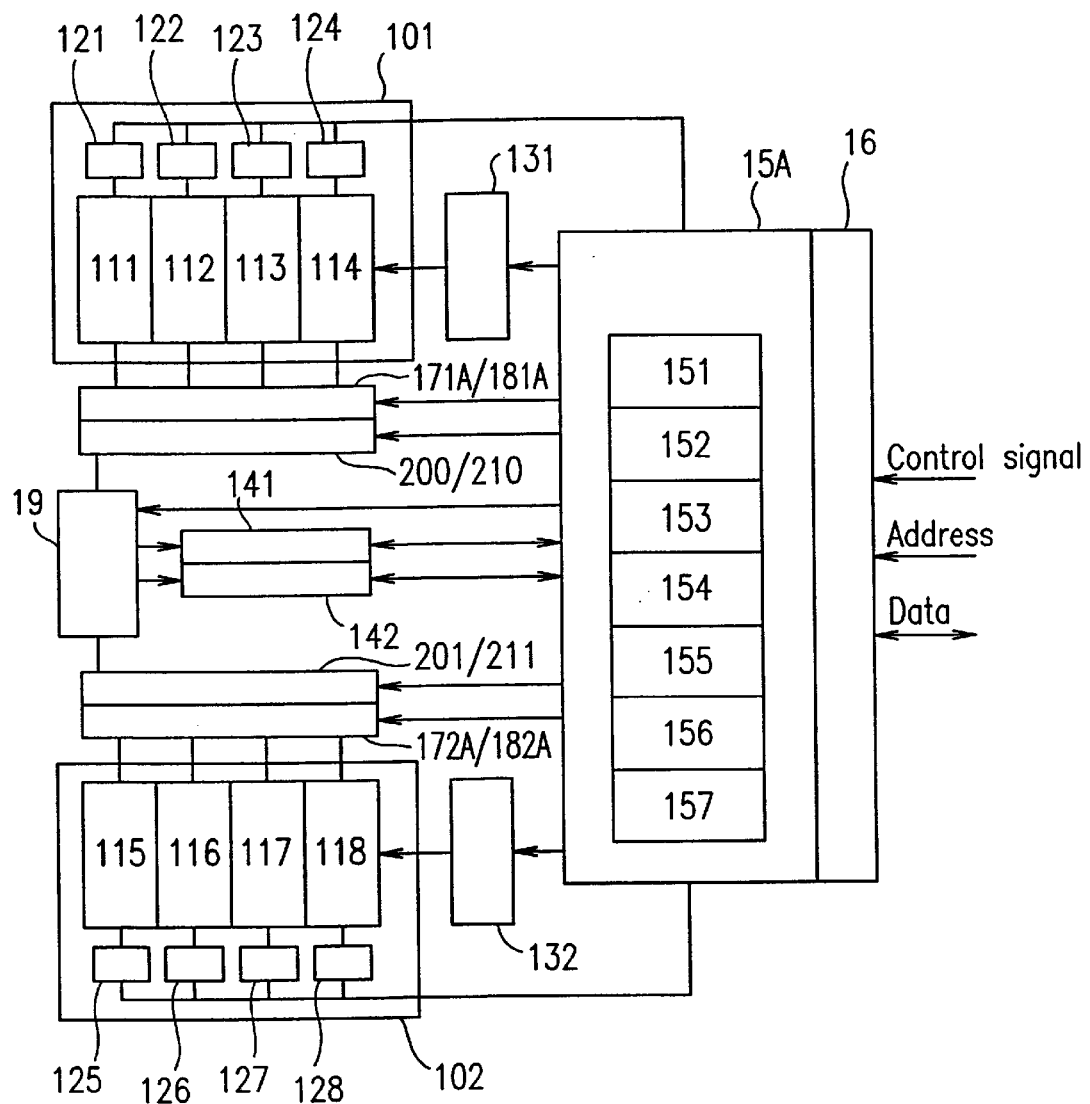
FIG. 3 is a block diagram illustrating a variation of the flash memory according to Example 1 of the present invention.

FIG. 3 is a block diagram illustrating a variation of the flash memory according to Example 1 of the present invention. This variation is identical with the flash memory shown in FIG. 1 except that block selection control circuits 200 and 201, and block selection circuits 210 and 211 are provided. This variation also includes Y decoders 171A and 172A respectively dedicated to the memory cell arrays 101 and 102, as in the case of the flash memory shown in FIG. 1.

In the variation of FIG. 3, upon receiving a control signal from the Y-decoder 171A (172A), the bit line selection circuit 181A (182A) selects one bit line for each of the blocks 111 to 114 (115 to 118). Next, upon receiving a control signal from the block selection control circuit 200 (201), the block selection circuit 210 (211) selects only one bit line among the bit lines selected for the respective blocks 111 to 114 (115 to 118). The sense amplifier switching circuit 19 couples the only bit line selected by the block selection circuit 210 (211) to the sense amplifier 141 or 142.

Figure 4:
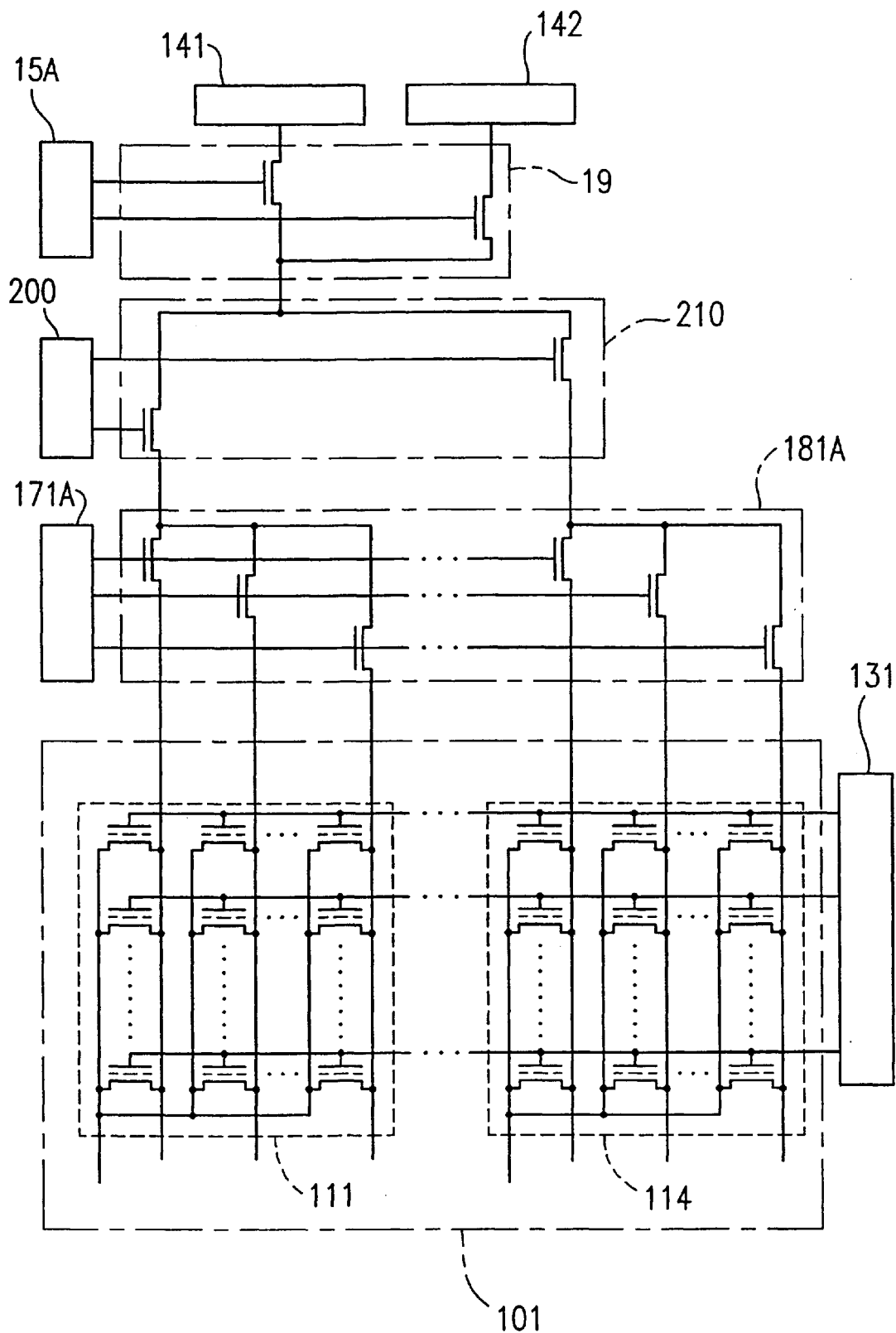
FIG. 4 is a diagram illustrating a sense amplifier switching circuit 19, a bit line selection circuit 181A, and a block selection circuit 210 in a variation of the flash memory according to Example 1 of the present invention.

FIG. 4 shows the internal structure of the sense amplifier switching circuit 19, the bit line selection circuit 181A, and the block selection circuit 210 in the above variation of the flash memory according to Example 1 of the present invention. In this variation, the block selection circuit 210 is included in addition to the sense amplifier switching circuit 19 and the bit line selection circuit 181, which are also included in the above-described structure shown in FIG. 2. The number of output bit lines of the Y-decoder 171A in the variation shown in FIG. 4 is smaller than the number of output bit lines of the Y-decoder 171 in the flash memory shown in FIG. 2. Therefore, the bit line selection circuit 181A and the Y-decoder 171A of this variation occupy a smaller area on the chip.

EXAMPLE 2

According to Example 2 of the present invention, one of two sense amplifiers is dedicated to reading purposes and the other is dedicated to verification purposes, thereby reducing the chip area.

A sense amplifier is essentially composed of differential amplifiers for amplifying a voltage difference between the two inputs. One of the inputs of each differential amplifier is coupled to a memory cell, whereas the other input is coupled to a reference cell which provides criteria for determining the state of writing/erasure, etc., of the memory cell in question. Accordingly, the number of memory cells which are simultaneously readable with one sense amplifier is dictated by, or equal to, the number of differential amplifiers incorporated in the sense amplifier.

For example, in the case of reading 8 bit cell information, 8 differential amplifiers will make it possible to read all the information at one time; however, using 4 differential amplifiers will require two readings and hence a reading time which is twice as long. When performing a read operation during an erase operation according to the present invention, by dedicating one of the two sense amplifiers to the read operation and providing in this sense amplifier the same number of differential amplifiers as in a sense amplifier of a conventional non-volatile memory device, a reading time will result which is equal to the reading time required for the conventional non-volatile memory device.

The other sense amplifier, which is dedicated to verification, requires at least one differential amplifier for satisfactory operation. It should be noted that the time required for erase verification decreases as the number of differential amplifiers increases; however, a larger number of differential amplifiers leads to more wiring and hence a larger chip area required. By providing the same number of differential amplifiers in the sense amplifier for the verification operation as in the sense amplifier for the read operation, there is provided a capability of performing a plurality of read operations at the same speed.

However, since a read operation can be performed relatively fast, it would be reasonable to dedicate one of the sense amplifiers to the read operation, while minimizing the size of the other sense amplifier so as to prevent increase in the area occupied on the chip. Thus, by dedicating one of the sense amplifiers to the read operation and the other to the verification operation, the sense amplifier for the erase-verification operation only needs to include one differential amplifier, thereby preventing any increase in the area occupied on the chip.

Figure 5:
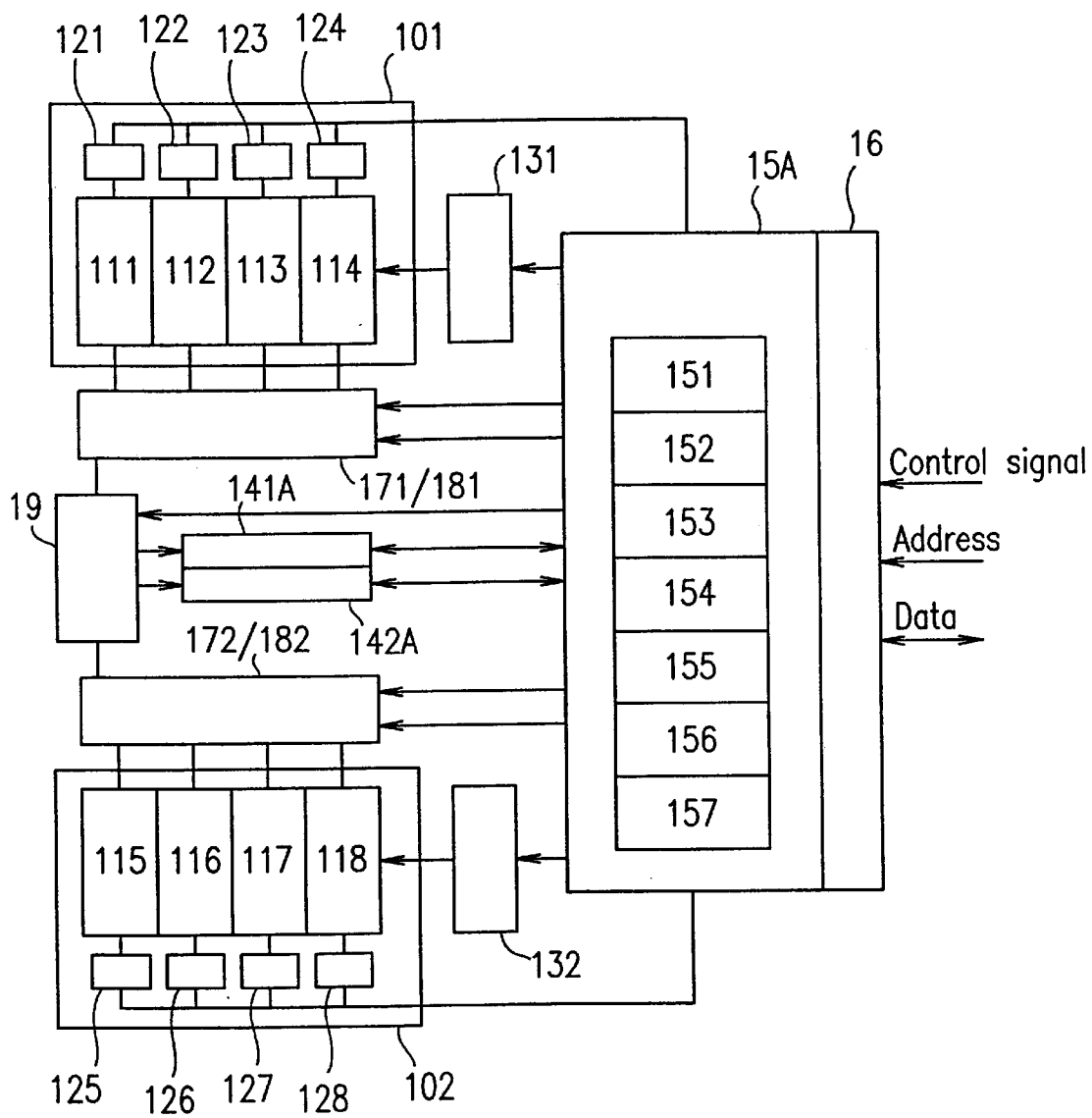
FIG. 5 is a block diagram illustrating the structure of a flash memory according to Example 2 of the present invention.

FIG. 5 is a block diagram illustrating the structure of a non-volatile memory device according to the present invention incorporating a sense amplifier dedicated to the read operation and a sense amplifier dedicated to the verification operation.

The non-volatile memory device shown in FIG. 5 is identical with the non-volatile memory device shown in FIG. 1 except that a sense amplifier 141A is dedicated to the read operation, whereas a sense amplifier 142A is dedicated to verification.

An erase operation for the block 111 in the memory cell array 101 occurs as follows. When the control circuit 15A receives an erase command, the erase control circuit 153 in the control circuit 15A switches the source line voltage switching element 121 which is coupled to the block 111, thereby setting the source voltage in the block 111 at a high voltage (e.g., 12 V).

Furthermore, the control circuit 15A applies a low voltage (e.g., 0 V) to all of the word lines in the memory cell array 101 (to which the block 111 belongs) via the X-decoder 131. Next, the control circuit 15A applies to the word lines a voltage necessary for the read operation (high voltage, e.g., 5 V) in order to perform an erase verify operation. In this state, the verify control circuit 156 in the control circuit 15A performs an erase verify operation by using the sense amplifier 142A dedicated to verification.

The present invention makes it possible to perform a read operation for a memory cell in the block 115 of the memory cell array 102 at the same time the above-described erase operation is taking place. When a read command is input to the control circuit 15A, the read control circuit 151 and the sense amplifier switching control circuit 157 check if the memory cell desired to be read is in a block within the same memory cell array 101 that the currently-erased block 111 belongs to.

If the memory cell to be read is determined to be in the same memory cell array 101 that the currently-erased block 111 belongs to, the control circuit 15A returns an error message to elements outside the nonvolatile memory device. If the memory cell to be read is determined to be in the other memory cell array 102, the control circuit 15A now knows that it is possible to read that memory cell, and hence applies a voltage necessary for the read operation (high voltage, e.g., 5 V) to the word lines. Moreover, the control circuit 15A switches the sense amplifier switching circuit 19 so as to make the sense amplifier 141A (dedicated to the read operation) available for the reading operation for the block 115.

Figure 6:
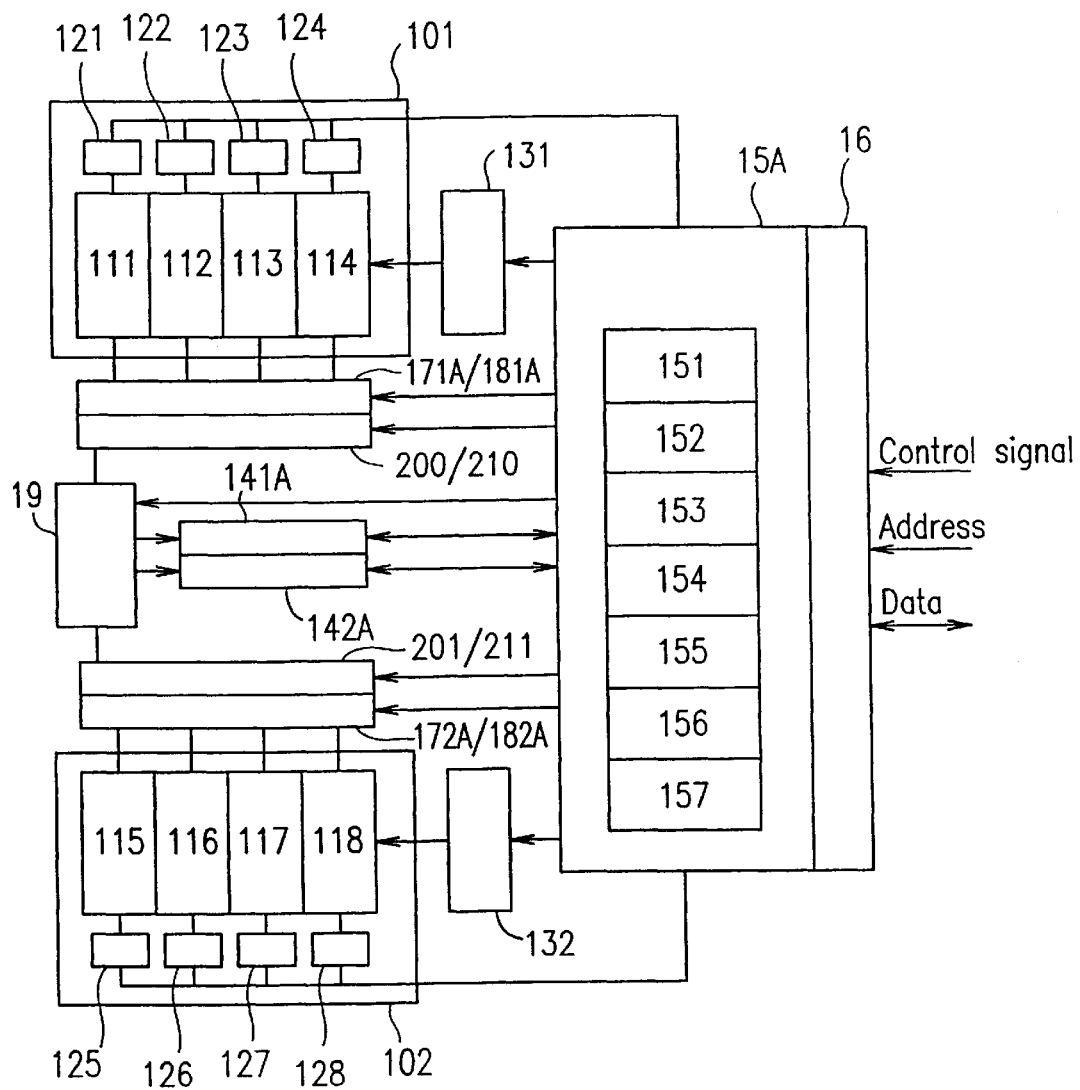
FIG. 6 is a block diagram illustrating a variation of the flash memory according to Example 2 of the present invention.
Figure 7:
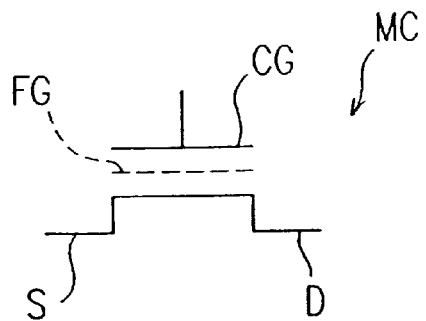
FIG. 7 is a schematic diagram illustrating the structure of a memory cell of a non-volatile memory device.

FIG. 6 is a block diagram illustrating a variation of the flash memory according to Example 2 of the present invention. This variation is identical with the flash memory shown in FIG. 5 except that Y-decoders 171A and 172A, bit line selection circuits 181A and 182A, block selection control circuits 200 and 201, and block selection circuits 210 and 211 are provided, as in the case of the variation of Example 1 shown in FIG. 3.

As in the case of the variation of Example 1, the number of output bit lines of the Y-decoder 171A in the variation shown in FIG. 6 is smaller than the number of output bit lines of the Y-decoder 171 in the flash memory shown in FIG. 5. Therefore, the bit line selection circuit 181A and the Y-decoder 171A of this variation occupy a smaller area on the chip, as in the case of the variation of Example 1.

As described above, the non-volatile memory device according to the present invention includes a plurality of memory cell arrays each including a plurality of blocks, where all data stored in each entire block is subject to erasure in a single erase operation. In each memory cell array (i.e., 101, 102), the corresponding word lines of each block (i.e., 111 to 114 and 115 to 118) are coupled to a common, so as to be commonly driven by decoders (i.e., 131, 132) respectively provided for the memory cell arrays (i.e., 101, 102). There is provided an equal or smaller number of sense amplifiers than the number of memory cell arrays. By simultaneously deploying the plurality of sense amplifiers, it is possible to perform a plurality of functions, that is, a combination selected from read operation, a write (including verification) operation, and an erase (including verification) operation.

As a result, the invention described herein makes possible the advantage of providing a non-volatile memory device which is capable of simultaneously performing an erase operation or write operation (including verification) and a read operation without the need of incorporating a plurality of such non-volatile memory devices, thereby minimizing the area occupied on the chip.

The above Examples illustrated embodiments incorporating two sense amplifiers. However, the present invention is not limited thereto but is generally applicable to two or more sense amplifiers.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile memory device comprising:
a plurality of memory cell arrays, each memory cell array including a plurality of blocks, each block comprising a matrix of memory cells coupled to one another via word lines and bit lines such that corresponding ones of the word lines in the plurality of blocks of each memory cell array are coupled to a common, the word lines being commonly driven by decoders respectively provided for the memory cell arrays, where all data stored in each block is subject to erasure in one erase operation, the non-volatile memory device further comprising:

a plurality of sense amplifiers for reading data from the memory cells; and a control circuit for simultaneously performing a plurality of operations by using the plurality of sense amplifiers, wherein the sense amplifiers enable the memory device to simultaneously perform any combination of a plurality of the following: a read operation, a write operation including a verification, and an erase operation including a verification.

2. The non-volatile memory device according to claim 1, wherein the number of the plurality of memory cell arrays is equal to the number of the plurality of sense amplifiers.

3. The non-volatile memory device according to claim 1, further comprising a sense amplifier switching circuit for switching one of the plurality of sense amplifiers coupled to a selected one of the plurality of memory cell arrays.

4. The non-volatile memory device according to claim 3, wherein the control circuit includes a sense amplifier switching control circuit for outputting a control signal, and the sense amplifier switching circuit switches one of the plurality of sense amplifiers coupled to the selected one of the plurality of memory cell arrays in accordance with the control signal.

5. The non-volatile memory device according to claim 1, wherein the non-volatile memory device further comprises a bit line selection circuit provided between the sense amplifier switching circuit and each of the plurality of memory cell arrays, the bit line selection circuit selecting a first bit line for each memory cell array from among the bit lines, and the sense amplifier switching circuit selectively couples one of the plurality of sense amplifiers to the first bit line.

6. The non-volatile memory device according to claim 5, wherein the non-volatile memory device further comprises a Y-decoder provided for each of the plurality of memory cell arrays, and the bit line selection circuit selects the first bit line in accordance with a signal from the Y-decoder.

7. The non-volatile memory device according to claim 3, wherein the non-volatile memory device further comprises:

a bit line selection circuit provided between the sense amplifier switching circuit and each of the plurality of memory cell arrays, the bit line selection circuit selecting first bit lines corresponding to the respective blocks, and a block selection circuit for selecting one of the first bit lines corresponding to the respective blocks, the sense amplifier switching circuit selectively coupling one of the plurality of sense amplifiers to the one of the first bit lines selected by the block selection circuit.

8. The non-volatile memory device according to claim 7, wherein the non-volatile memory device further comprises a Y-decoder provided for each of the plurality of memory cell arrays, and a block selection control circuit provided for each of the plurality of memory cell arrays, and wherein the bit line selection circuit selects the first bit line in accordance with a signal from the Y-decoder, and the block selection circuit selects one of the first bit lines in accordance with a signal from the block selection control circuit.

9. The non-volatile memory device according to claim 1, wherein the plurality of operations comprise a read operation, an erase operation including verification, and a write operation including verification.

10. A non-volatile memory device comprising:

a plurality of memory cell arrays, each memory cell array including a plurality of blocks, each block comprising a matrix of memory cells coupled to one another via word lines and bit lines such that corresponding ones of the word lines in the plurality of blocks of each memory cell array are coupled to a common, the word lines being commonly driven by decoders respectively provided for the memory cell arrays, where all data stored in each block is subject to erasure in one erase operation;

a plurality of sense amplifiers for reading data from the memory cells; and a control circuit for simultaneously performing a plurality of operations by using the plurality of sense amplifiers, wherein the sense amplifiers enable the memory device to simultaneously perform a combination selected from the group consisting of read, write/verification and erase/verification simultaneously using the plurality of sense amplifiers.

11. The non-volatile memory device according to claim 10, wherein the plurality of sense amplifiers comprise a sense amplifier dedicated to the read operation, a sense amplifier dedicated to the write operation, a sense amplifier dedicated to the erase operation and a sense amplifier dedicated to the verification.

* * * * *